(12) United States Patent
Chen et al.

(10) Patent No.: US 6,639,420 B1
(45) Date of Patent: Oct. 28, 2003

(54) COMMON PROBE CARD FOR FLIP-CHIP DEVICES

(75) Inventors: Po-Chu Chen, Hsin-chu (TW); Chao-Hsiang Yang, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/266,457

(22) Filed: Oct. 8, 2002

(51) Int. Cl.[7] .............................................. G01R 31/02
(52) U.S. Cl. ..................... 324/765; 324/765; 324/158.1
(58) Field of Search ................................ 324/754, 758, 324/158.1, 765, 762, 72.5; 439/66, 482; 438/14, 17, 18

(56) References Cited

U.S. PATENT DOCUMENTS 5,155,065 A * 10/1992 Schweiss ................... 438/599
5,490,042 A * 2/1996 Perkins ....................... 361/778
5,923,178 A * 7/1999 Higgins et al. ............. 324/754
6,456,099 B1 * 9/2002 Eldridge et al. ............ 324/754

* cited by examiner

*Primary Examiner*—Kamand Cuneo
*Assistant Examiner*—Jimmy Nguyen
(74) *Attorney, Agent, or Firm*—George O. Saile; Stephen B. Ackerman; Douglas R. Schnabel

(57) ABSTRACT

A new method to test multiple integrated circuit device designs using a single, probe card design is achieved. The method compriseproviding a plurality of integrated circuit device designs each having a probe pad array comprising a fixed pitch. A first integrated circuit device having a first design is loaded on a probing stage. The first integrated circuit device is probed using a vertical probe card comprising a probe tip array. The probe tip array comprises the same fixed pitch. An automated tester is thereby coupled to the first integrated circuit device. The first integrated circuit device is tested with the automated tester. The steps of loading, probing, and testing are repeated on at least one other integrated circuit device having a differing design than the first integrated circuit device.

20 Claims, 8 Drawing Sheets

COMMON PROBE CARD FOR FLIP-CHIP DEVICES

BACKGROUND OF THE INVENTION (1) Field of the Invention

The invention relates to a method for testing integrated circuit devices, and, more particularly, to a method to test multiple designs using a single, probe card design.

(2) Description of the Prior Art

Testing is a key enabling technology in the art of integrated circuit manufacturing. Typically, testing is performed at the wafer-level and at the packaging level. When a device is tested at the wafer level, coupling between the device under test (DUT) and the automated test system is made possible using a probe card. Referring now to FIG. 1, a simplified, automated test system is shown. Automated test equipment (ATE) 10 comprises a very high speed and high precision testing circuit. The ATE 10 is coupled to a wafer prober station 14. The wafer prober 14 contains a test head, or probe head 18. Wafers are loaded into the test head where they are placed on a wafer stage for testing.

The automated test system is typically a very expensive tool. It is therefore designed as a general-purpose tool to test a number of different integrated circuit designs. Flexibility of use is derived by storing a number of testing programs in the ATE 10 that may be selected by the user interface 22 prior to each test. In addition, it is well-known that integrated circuit devices employ a variety of input/output (I/O), power, and ground pin outs. Therefore, the test system must be able to account for these differences. Commonly, this flexibility is derived by using probe cards.

A probe card is an interface card between the probe head 18 and the DUT. The probe card translates the fixed pin-out capabilities, such as hard wired input channels or output channels, of the ATE into a flexible arrangement of pins custom interfaced to a specific IC design. In this way, the ATE system 10 can be used to test a number of different designs using a common, and often quite expensive, probe head 18.

Referring now to FIG. 2, an exemplary probe card 30 and integrated circuit 38 combination is shown in top view. The integrated circuit die 38 comprises internal circuitry that is connected to pads 42 that ring the periphery of the device. These pads 42 may comprise bonding pads. A bonding pad is a metal pad to which a metal wire is bonded, or welded, to create an interconnection between the device and an encapsulating package. The probe card 30 comprises a corresponding set of probe pins 34 that are aligned to physically touch each of the probe pads 42 in the DUT. The probe card 30 couples these probe pins 34 to interconnecting metal lines in the probe card structure that will connect to the probe head of the ATE system when the card 30 is installed in the probe head.

Referring now to FIG. 3, a cross section view of the probe card 30 and integrated circuit device 38 combination is shown. In the typical case, a plurality of circuit die 38 are formed on a single wafer. In this example, a single die 38 is contacted by the probe card 30 for testing. In practice, multiple dice could be probed at one time. The wafer is placed onto a wafer stage 50 and may be further held in place using vacuum. The probe card 30 is fixably attached to the probe head to provide electrical coupling to the ATE and to allow alignment and vertical movement. In a typical arrangement, the probe card 30 is aligned to the wafer under test at a first die location on the wafer. After successful alignment, the probe card 30 may then be indexed across the wafer to test each die 38. The probe card 30 is engaged for testing by vertically moving the card down until the probe pins 34 contact the probe pads 42.

Referring now to FIG. 4, an additional exemplary integrated circuit device 60 is shown. Pads 64 are again included around the periphery of the device 60. In this case, however, the integrated circuit device 60 is a flip chip device. In a flip chip device, raised bumps 68 are formed on the surface of the chip. Instead of wire bonding the die to a package, the circuit die 60 is flipped over and attached directly to a system-level circuit, such as a circuit board or a ceramic substrate. To facilitate this direct connection, the raised bumps commonly comprise a top layer of solder that can be easily melted to create a permanent connection to the circuit board. In the exemplary case, the solder bumps are connected to the wire bonding pads using a redistribution layer 72, such as metal lines.

Referring now to FIG. 5, another probe card is shown in cross section. This probe card is a vertical probe card comprising a probe head 80, probes 84, and a bottom guide plate 88. Vertical probe cards are commonly used for flip chip devices. Typically, vertical probe cards require 3 to 4 months to fabricate. More importantly, each integrated circuit design requires a customized card to fit the dimensions and pin out of the device. Further, due to the long fabrication time, the integrated circuit manufacturer must purchase several vertical probe cards for each device in case the probe card breaks. A significant goal of the present invention is to reduce the cost and lead time needed for probe cards.

Several prior art inventions relate to probe cards and to methods to test integrated circuits. U.S. Pat. No. 6,293,003 B1 to Sakurai et al shows an electronic part mounting device. U.S. Pat. No. 5,642,056 to Nakajima et al teaches a probe card apparatus having the ability to automatically correct the probe card posture prior to testing. U.S. Pat. No. 6,300,786 B1 to Doherty et al disclose a wafer test system having a probe card. The probe card contains an on-board multiplex circuit to allow testing of multiple dice in parallel.

SUMMARY OF THE INVENTION

A principal object of the present invention is to provide an effective and very manufacturable method to test multiple integrated circuit device designs using a single, probe card design.

A further object of the present invention is to provide a universal, probe card design to test a plurality of integrated circuit devices at the wafer level.

A yet further object of the present invention is to form integrated circuit probe pads in a fixed pitch array and to form probe card probe pins in the same fixed pitch array.

A yet further object of the present invention is to provide a method to test flip chip, integrated circuits using a universal probe card.

A yet further object of the present invention is to reduce probe card proliferation and cost.

A yet further object of the present invention is to provide a method to re-use a probe card as a design shrinks.

Another further object of the present invention is to provide a universal, probe card for testing multiple, integrated circuit device designs.

In accordance with the objects of this invention, a method to test multiple integrated circuit device designs using a single, probe card design is achieved. The method comprise providing a plurality of integrated circuit device designs each having a probe pad array comprising a fixed pitch. A first integrated circuit device having a first design is loaded on a probing stage. The first integrated circuit device is probed using a vertical probe card comprising a probe tip array. The probe tip array comprises the same fixed pitch. An automated tester is thereby coupled to the first integrated circuit device. The first integrated circuit device is tested with the automated tester. The steps of loading, probing, and testing are repeated on at least one other integrated circuit device having a differing design than the first integrated circuit device.

Also in accordance with the objects of this invention, a universal, probe card apparatus for testing multiple integrated circuit device designs on an automated tester is achieved. The probe card apparatus comprises an interconnection system. A probe tip array is coupled to the interconnection system such that a probed integrated circuit device is coupled to an automated tester. The probe tip array has a fixed pitch. The probe pad arrays on a plurality of integrated circuit device designs comprise the same fixed pitch.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to test multiple, integrated circuit device designs using a single, probe card design. A universal probe card design is possible using a common probe pad and probe pin configuration. It should be clear to those experienced in the art that the present invention can be applied and extended without deviating from the scope of the present invention.

Figure 6:
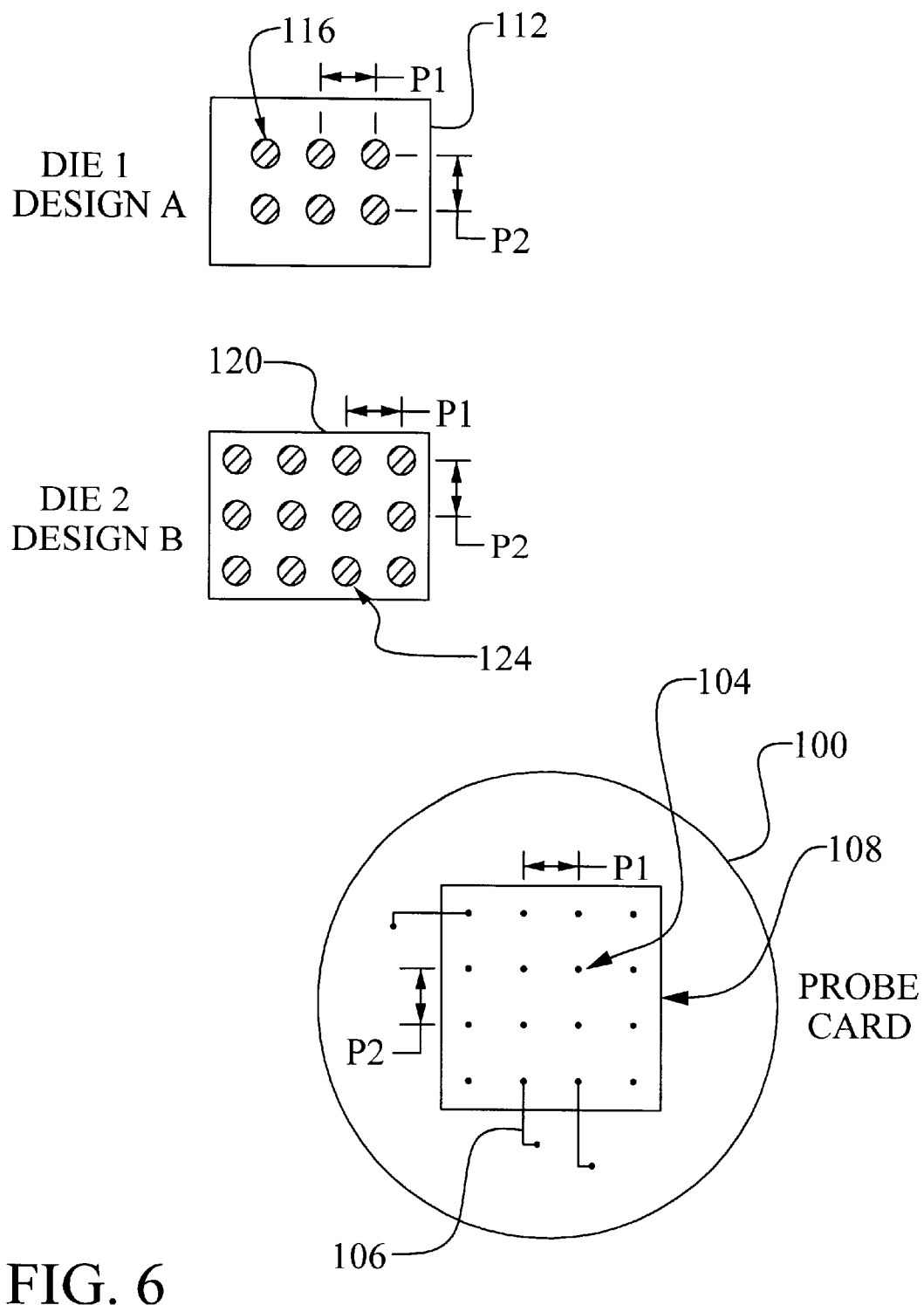
FIG. 6 illustrates a first preferred embodiment of the present invention.

Referring now to FIG. 6, the preferred embodiment of the present invention is illustrated. Several important features of the present invention are shown and discussed below. A novel method to test multiple integrated circuit device designs 112 and 120 using a single, probe card design 100 is achieved. The method comprise providing a plurality of integrated circuit device designs 112 and 120 each having an array of probe pads 116 and 124 comprising a fixed pitch P1 and P2. In this example, two integrated circuit device designs, A 112 and B 120 are used. In design A 112, an array of six probe pads 116 is formed. These pads 116 comprise probing pads and, more preferably, flip chip bumps. Most preferably, the flip chip bumps 116 comprise a top layer of solder.

The probing pads 116 are arranged in a column and row array. Most importantly, the array comprises a fixed pitch P1 and P2. That is, the centerline to centerline distance between any two pads 116 in a row is a constant value of P1, and the centerline to centerline distance between any two pads in a column is a constant value of P2. Most preferably, P1 and P2 are equal. However, this is not necessary.

Design B 120 comprises an array of pads 124 arranged in rows and columns. However, in design B, the array is three rows and four columns. Most importantly, the row pitch P1 of design B must be the same as row pitch P1 of design B. Similarly, the column pitch P2 of design B must be the same as the column pitch P2 of design B. As will be described below, the configuration of the pad arrays of designs A and B allows a single probe card design 100 to be used for testing each design. Further, a plurality of such. integrated circuit designs may be constructed after the form of A 112 and B 120. Each design in the family of designs would use an array of pads having the common row pitch of P1 and common column pitch of P2.

A universal, vertical probe card 100 is defined for the family of designs represented by A 112 and B 120. The universal probe card 100 comprises an array 108 of probe pins 104 arranged in rows and columns. Most importantly, the row pitch P1 is formed to equal the row pitch P1 of the design family, and the column pitch P2 of the probe card 100 is made to equal the column pitch P2 of the design family.

Figure 1:
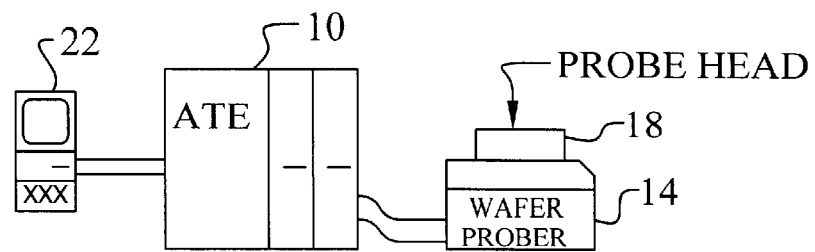
FIG. 1 illustrates an automated test system for testing integrated circuit devices.
Figure 2:
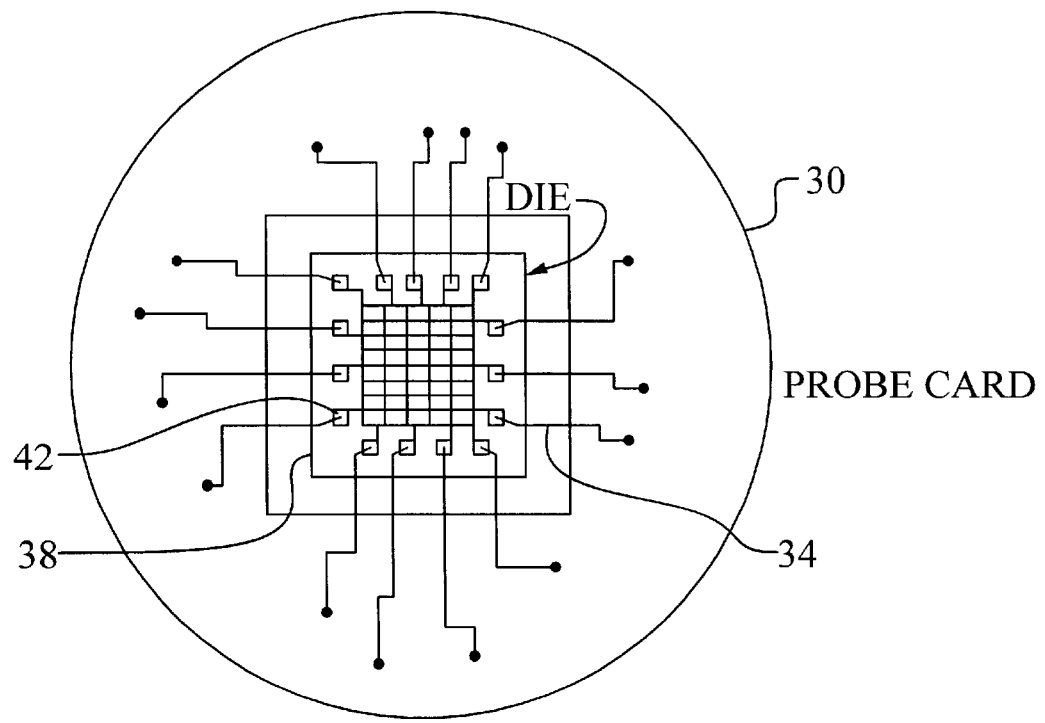
FIGS. 2 and 3 illustrates a simplified version of a probe card and an integrated circuit device in top view and in cross section.
Figure 3:
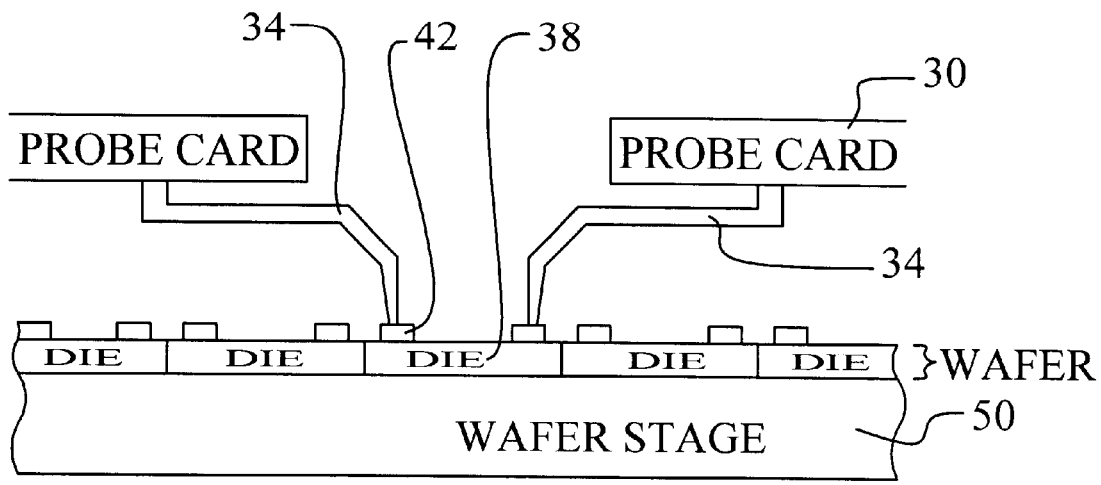
Figure 4:
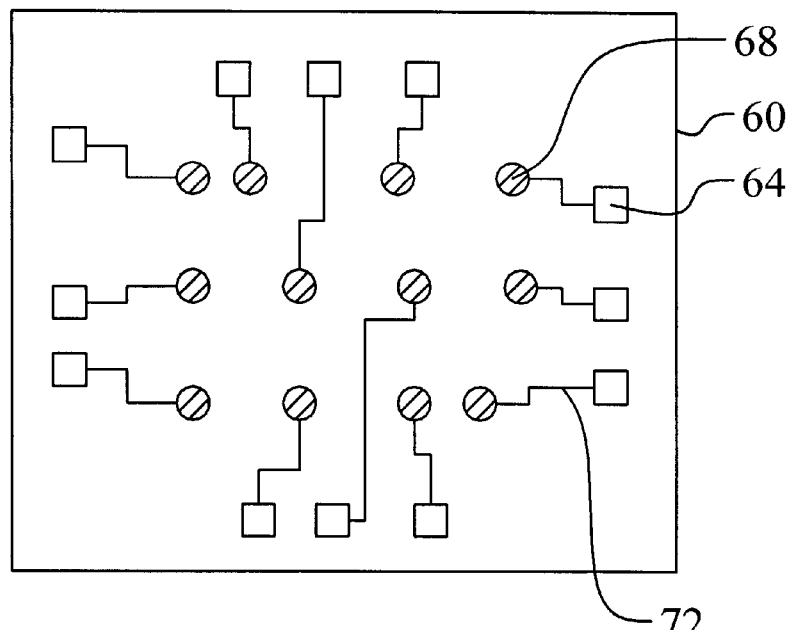
FIG. 4 illustrates an integrated circuit, flip chip device.
Figure 5:
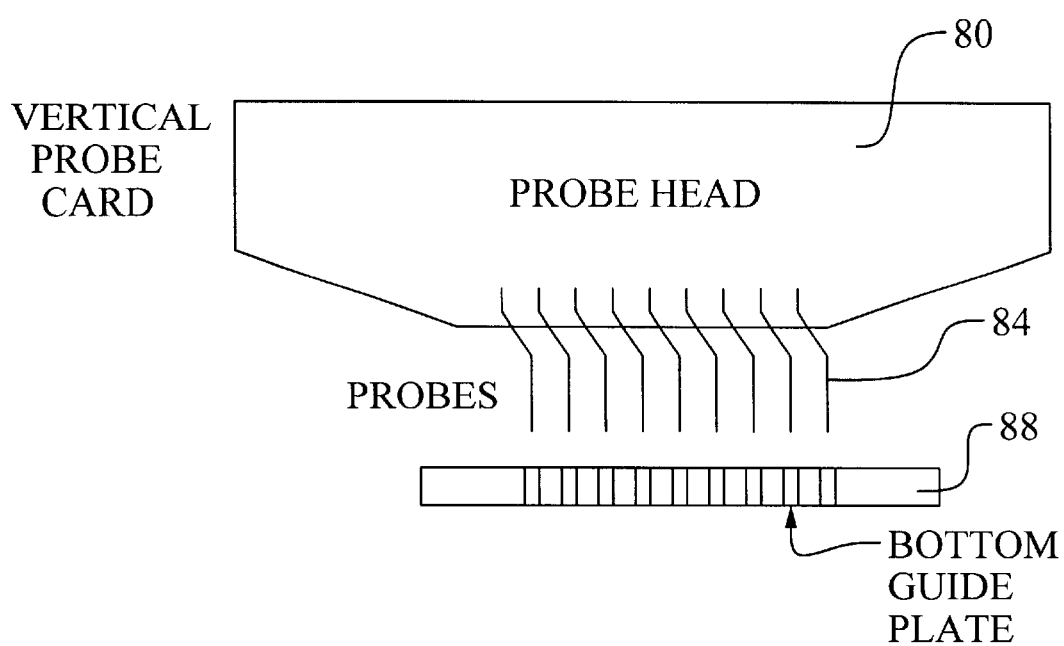
FIG. 5 illustrates a vertical probe card in cross section.

Returning to the method sequence, a first integrated circuit device, such as design A 112, is loaded on a probing stage, not shown. The first integrated circuit device A 112 is then probed using a vertical probe card 100 that has been suitably loaded into the testing head of an automated test system as shown by FIG. 1. The automated tester is thereby coupled to the first integrated circuit device 112. The first integrated circuit device 112 is then tested with the automated tester. After the integrated circuit wafer of design A 112 has been tested, the method of the present invention allows a subsequent wafer of another design in the design family, such as design B 120, to be tested using the same probe card 100. These steps of loading, probing, and testing are then repeated on at the second integrated circuit device.

Note that the probe card 100 array 108 size sets the maximum allowable size for any member of the design family. For example, the probe card array 108 shows a 4×4 array of pins 104. Therefore, the card 100 is capable of testing up to a 16-pad design. A particularly important feature of the present invention is the fact that designs having fewer pads than the available number of pins 104 can be tested without damaging the circuits 112 and 120. Typically, flip chip bumps 116 and 124 are formed such that the topmost surface of the bump extends substantially above the common surface of the circuit die. In this way, when the die is flipped over and placed on the host circuit board or substrate, the die is physically suspended by the bumps. During the testing method of the present invention, the probe pins 104 contact these elevated bump surfaces. For example, the top left probe pin 104 of the probe card 100 may be aligned to contact the top left bump 116 of design A 112. In this case, several probe pins 104, such as the bottom right pin, will not be needed for testing design A 112 since there are more pins (16) than circuit pads (6). However, the unused probe pins will not contact the integrated circuit die 112 or any neighboring die on the wafer under test. The elevation of the bumps 116 should suspend the unused probe pins 104 above the surface of the wafer such that no damage to the die under test, or any other die, occurs.

The method of the present invention allows a single, probe card design 100 to be used to test a family of product designs 112 and 120. There are several advantages to this approach. First, it is not necessary to change probe cards prior to the testing of each product type within the family. This saves setup time. Second, fewer probe cards need to be fabricated. It is only necessary to keep a sufficient quantity of spare, but identical, probe cards 100 on hand to cover breakage and wear. Each design family has a dedicated card design. Therefore, significant cost and wait time is saved.

Referring again to FIG. 6, the universal, probe card apparatus 100 for testing multiple integrated circuit device designs 112 and 120 on an automated tester can now be described. The probe card apparatus 100 comprises an interconnection system 106. An array 108 of probe pins 104 is coupled to the interconnection system such that a probed integrated circuit device 112 or 120 is coupled to an automated tester. The probe tip array 108 has a fixed pitch P1 and P2. The probe pad 116 and 124 arrays on a plurality of integrated circuit device designs 112 and 120 comprise the same fixed pitch P1 and P2.

Figure 7:
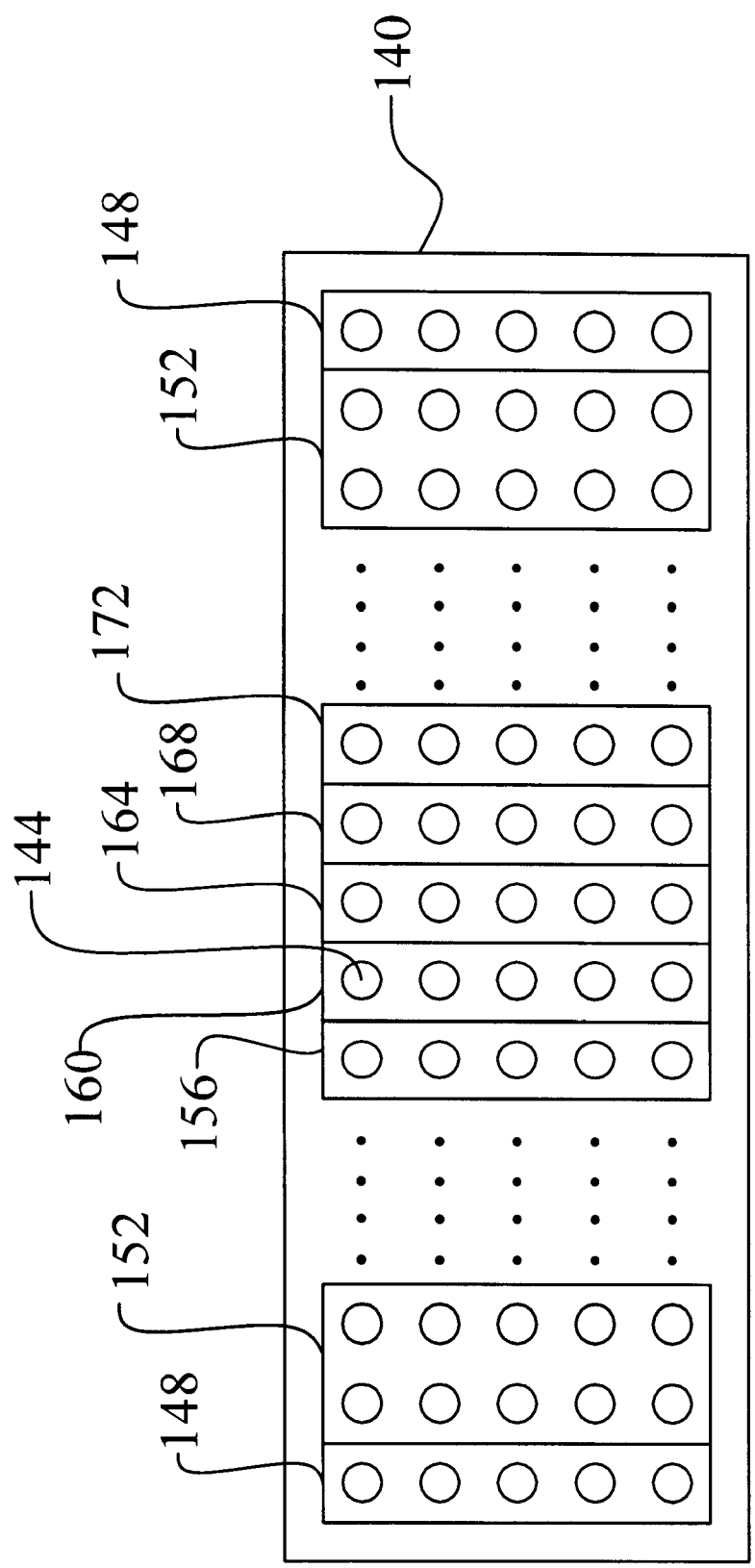
FIG. 7 illustrates a second preferred embodiment of the present invention.

Referring now to FIG. 7, a second preferred embodiment of the present invention is shown. An additional standardization of the invention is shown. In this embodiment, the array of probe card pins and probe pads are illustrated as a single array 140. Again, the array has a fixed pitch as in the first embodiment of FIG. 6. However, this array 140 standardizes specific locations in the array for specific types of uses. For example, array locations within the 152 region are defined for I/O pins. Therefore, the integrated circuit is designed to place I/O pins in region 152, and the universal probe card is designed to place automated tester I/O channels in region 152. In addition, some devices, especially those containing several types of circuits, require a plurality of power supplies. In this example, regions of the array are defined for multiple power supply connections. For example region 156 is defined for the first power supply PS1. Regions 160, 164, 168, and 172 are defined for additional power supplies PS2–PS5. Regions 148 are then reserved for ground connections. The novel method and apparatus of the present invention is useful for forming designs comprising many types of circuits, such as memory circuits, logic circuits, embedded controllers, mixed signal circuits, and combinations thereof.

Figure 8:
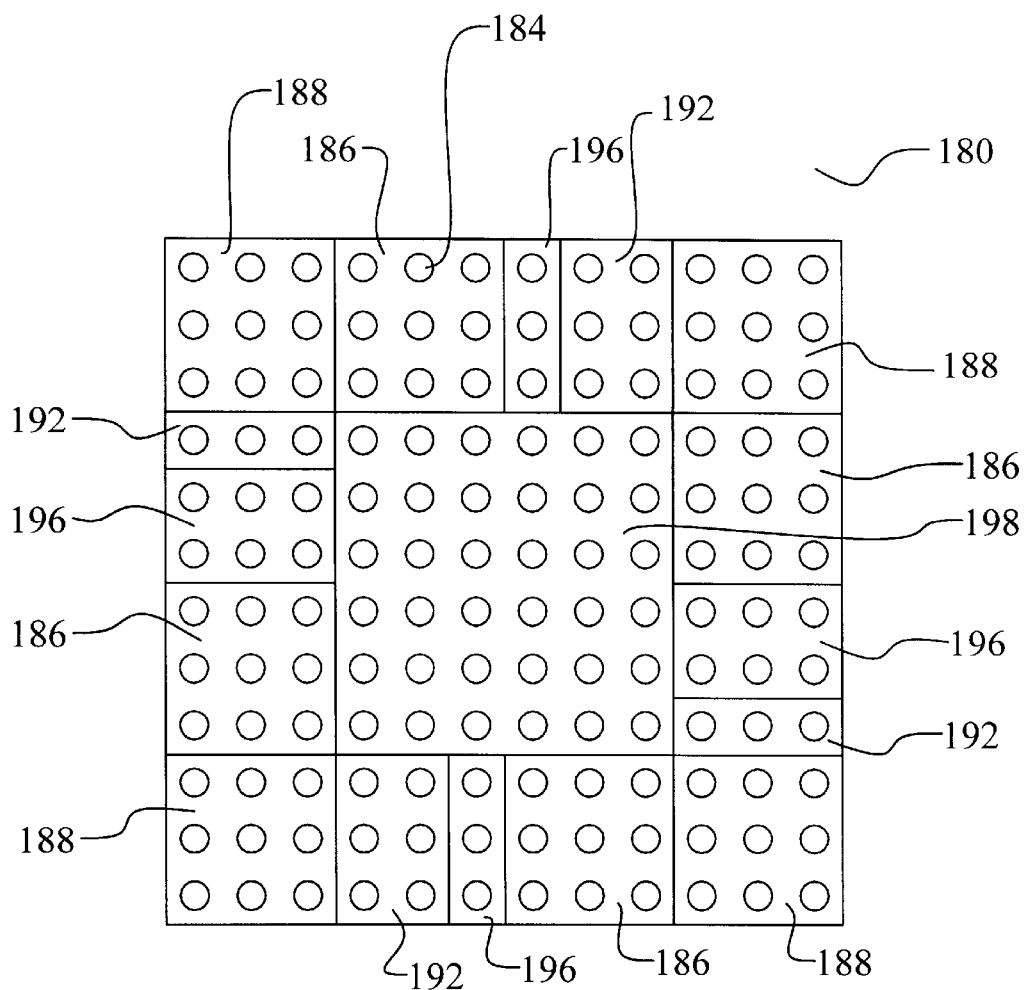
FIG. 8 illustrates a third preferred embodiment of the present invention.

Referring now to FIG. 8, a third preferred embodiment shows another example of a standardized array configuration of the present invention. In this case, the standardized array 180 is especially configured for use in a family of memory designs. There are 12 pins for the first power supply PS1 in regions 192 and 12 pins for the second power supply PS2 in regions 196. There are 36 ground pins in regions 186. There are 36 driver pins in regions 188, and 36 I/O pins in region 198.

Figure 9:
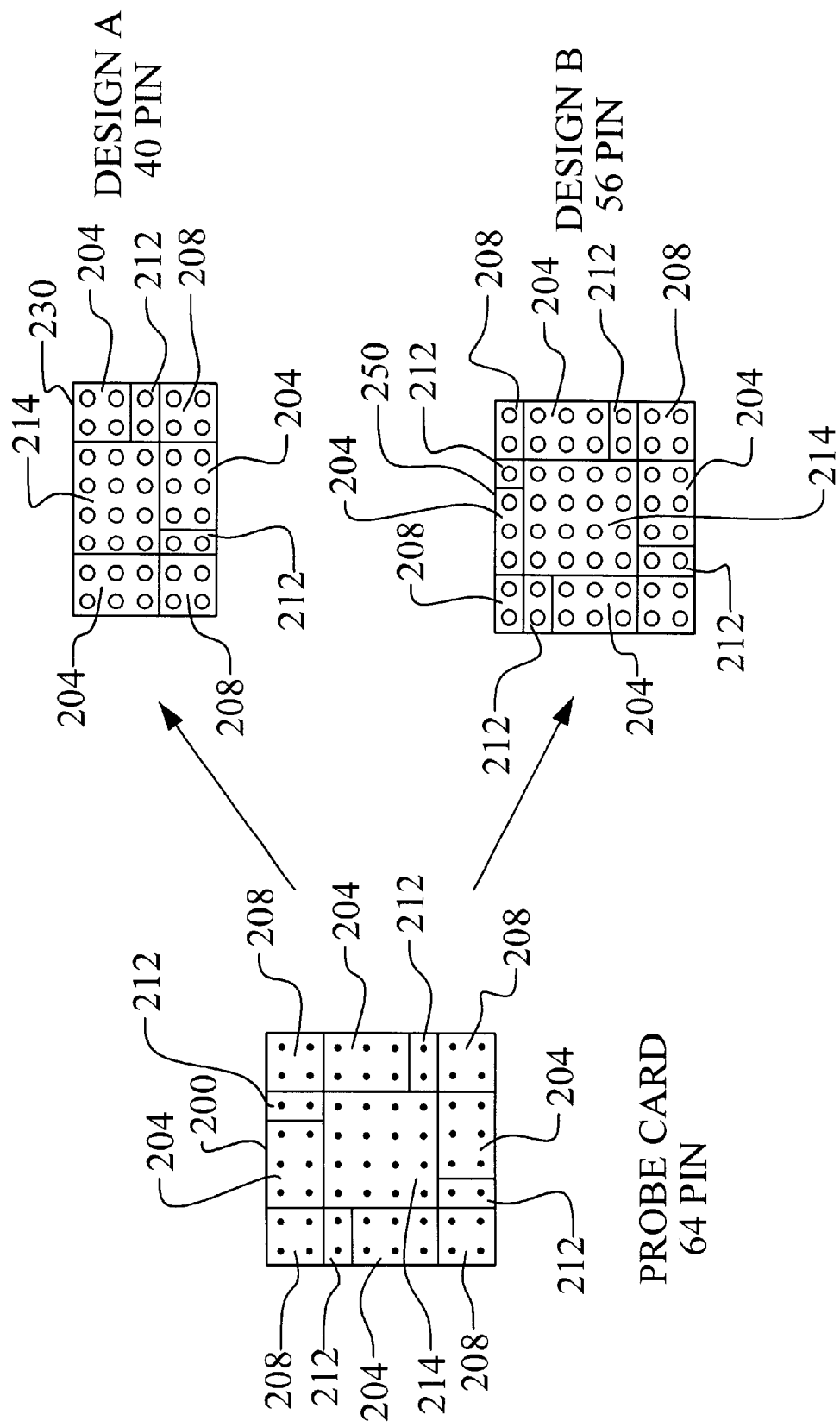
FIG. 9 illustrates the third preferred embodiment of the present invention showing the testing of two designs using a universal probe card.

Referring now to FIG. 9, a probe card 200 with a standardized array similar to that of FIG. 8 is shown. In FIG. 9, a 64-pin standard probe card comprises standard regions 204, 208, 212, and 214. This probe card is used for testing a 40-pin design A 230 and a 56-pin design B 250. In each case, the designs 230 and 256 use a subset of the available pin array of the probe card 200. By configuring the universal probe card 200 and the design family 230 and 250 using the standard configuration, a family of memory designs 230 and 250 can be tested using a common card 200.

Figure 10:
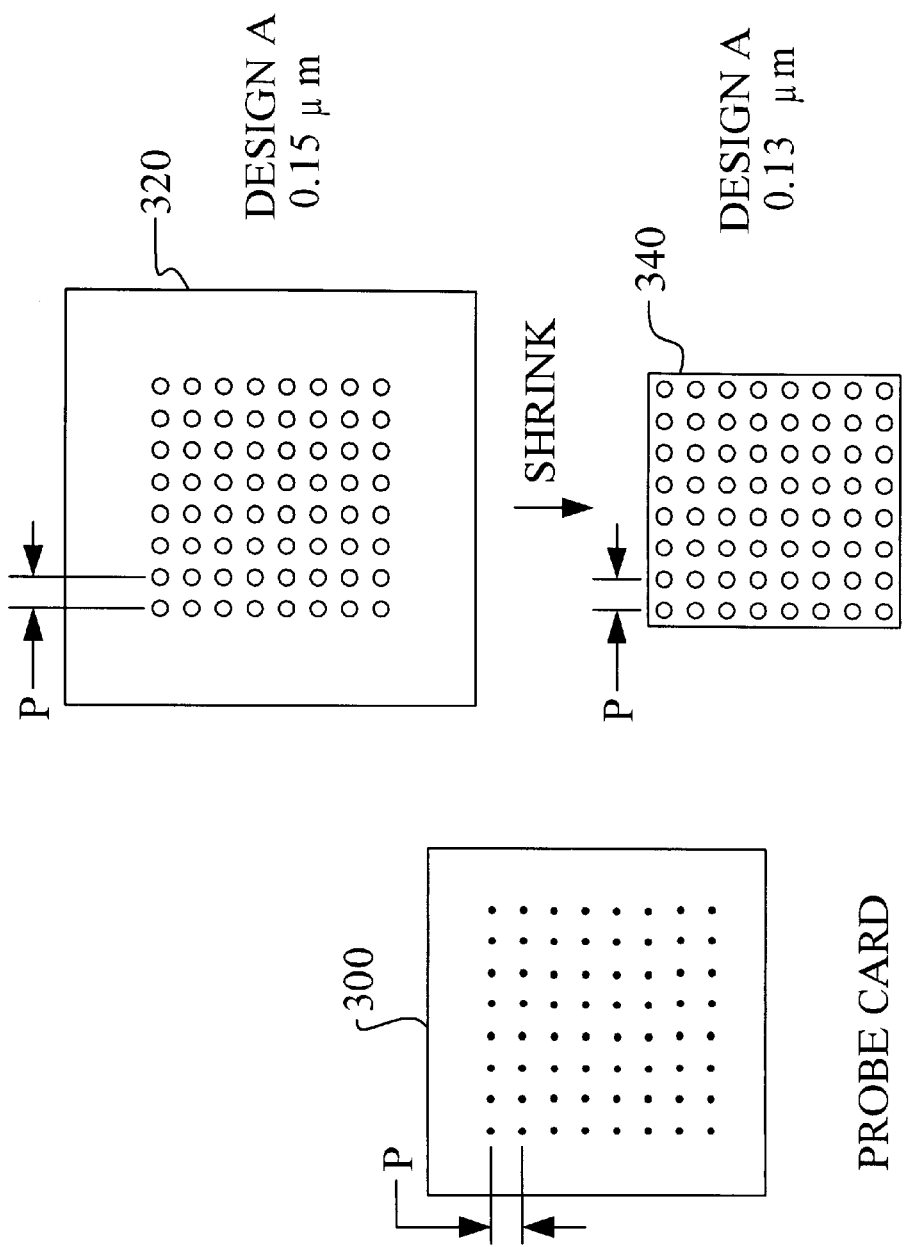
FIG. 10 illustrates a fourth preferred embodiment of the present invention showing the testing of pre-shrink and post-shrink versions of an integrated circuit design using a single, probe card design.

Referring now to FIG. 10, a fourth embodiment of the present invention is illustrated. In this case, a standard probe card 300 of the present invention is used to test a design over a range of technology shrinks. For example, design A is laid out 320 for a 0.15 micron process. The probe card array 300 pitch P matches the pitch P of the 0.15 micron design 320. At some point, design A is shrunk to correspond to a 0.13 micron version of the process. The die. area of the 0.13 micron layout 340 is much less than that of the 0.15 micron layout 320 and results in significant cost savings. At this point, it is particularly advantageous to use the same pad array pitch P on the new layout 340. A redistribution layer, not shown, may be used to re-route connective lines to the bump array so that the bump array can maintain a constant size before and after the shrink. In this way, the probe card design 300 can be re-used for the shrunk version 340 of design A.

The advantages of the present invention may now be summarized. An effective and very manufacturable method to test multiple integrated circuit device designs using a single, probe card design is provided. A universal, probe card design is provided to test a plurality of integrated circuit devices at the wafer level. Integrated circuit probe pads and probe card probe pins are designed in the same fixed pitch array. The probe card can thereby be used for a family of integrated circuit devices. A method to test flip chip, integrated circuits using a universal probe card is disclosed. Probe card proliferation and cost is reduced. A method to re-use a probe card as a design shrinks is disclosed. The universal, probe card is described.

As shown in the preferred embodiments, the novel method and apparatus of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to test multiple integrated circuit device designs using a single probe card design, said method comprising:

provide a plurality of integrated circuit device designs each having a two dimensional probe pad array comprising a fixed pitch wherein said probe pad array is greater than two rows and greater than two columns;

loading a first said integrated circuit device having a first design on a probing stage;

probing said first integrated circuit device using a vertical probe card comprising a two dimensional probe tip array wherein said probe tip array comprises the same said fixed pitch, wherein said probe tip array is greater than two rows and greater than said two columns, and wherein an automated tester is thereby coupled to said first integrated circuit device;

testing said first integrated circuit device with said automated tester; and repeating said steps of loading, probing, and testing, on at least one other said integrated circuit device having a differing design than said first integrated circuit device.

2. The method according to claim 1 wherein said probe pads comprise flip chip bumps.

3. The method according to claim 2 wherein said flip chip bumps comprise solder.

4. The method according to claim 1 wherein said integrated circuit devices comprise circuits selected from the group consisting of: memory circuits, logic circuits, embedded controllers, mixed signal circuits, and combinations thereof.

5. The method according to claim 1 wherein said probe tip array comprises a larger number of elements than said probe pad array and wherein excess said probe tips do not damage said integrated circuit device during said steps of probing and testing.

6. The method according to claim 1 wherein said probe pad array and said probe tip array further comprise a standard assignment of signal types to array locations.

7. The method according to claim 1 wherein said probe pad arrays are coupled to circuits within said integrated circuit device by a redistribution layer.

8. The method according to claim 1 wherein said probe pad array and said probe tip array are configured to fit, without alteration, said plurality of integrated circuit device designs prior to and after shrinkage of mask used to form said integrated circuit device designs.

9. A method to test multiple integrated circuit device designs using a single probe card design, said method comprising:
    providing a plurality of integrated circuit device designs each having a two dimensional probe pad comprising a fixed pitch wherein said probe pad array is greater than two rows and greater than two columns and wherein said probe pads comprise flip chip bumps;
    loading a first said integrated circuit device on a probing stage;
    probing said first integrated circuit device using a vertical probe card comprising a two dimensional probe tip array wherein said probe tip array comprises the same said fixed pitch, wherein said probe tip array is greater than two rows and greater than said two columns, wherein said probe tip array comprises a larger number of elements than said probe pad array, wherein excess said probe tips do not damage said first integrated circuit device, and wherein an automated tester is thereby coupled to said first integrated circuit device;
    testing said first integrated circuit device with said automated tester; and
    repeating said steps of loading, probing, and testing, for at least one other said integrated circuit device having a differing design than said first integrated circuit device.

10. The method according to claim 9 wherein said flip chip bumps comprise solder.

11. The method according to claim 9 wherein said integrated circuit devices comprise circuits selected from the group consisting of: memory circuits, logic circuits, embedded controllers, mixed signal circuits, and combinations thereof.

12. The method according to claim 9 wherein said probe pad array and said probe tip array further comprise a standard assignment of signal types to array locations.

13. The method according to claim 9 wherein said probe pad arrays are coupled to circuits within said integrated circuit device by a redistribution layer.

14. The method according to claim 9 wherein said probe pad array and said probe tip array are configured to fit, without alteration, said plurality of integrated circuit device designs prior to and after shrinkage of masks used to form said integrated circuit device designs.

15. A universal probe card apparatus for testing multiple integrated circuit device designs on an automated tester, said probe card apparatus comprising:
    an interconnection system;
    a two dimensional probe tip array coupled to said interconnection system such that a probed integrated circuit device is coupled to an automated tester wherein said probe tip array has a fixed pitch, wherein said probe tip array is greater than two rows and greater than said two columns, wherein probe pad arrays on a plurality of said integrated circuit device designs comprise the same said fixed pitch, and wherein said probe pad arrays are greater than two rows and greater than two columns.

16. The probe card apparatus according to claim 15 wherein said integrated circuit probe pads comprise flip chip bumps.

17. The probe card apparatus according to claim 15 wherein said integrated circuit devices comprise circuits selected from the group consisting of: memory circuits, logic circuits, embedded controllers, mixed signal circuits, and combinations thereof.

18. The probe card apparatus according to claim 15 wherein said probe tip array comprises a larger number of elements than said probe pad array and wherein excess said probe tips do not damage said integrated circuit devices during probing and testing.

19. The probe card apparatus according to claim 15 wherein said probe pad array and said probe tip array further comprise a standard assignment of signal types to array locations.

20. The probe card apparatus according to claim 1 wherein said probe pad array and said probe tip array are configured to fit, without alteration, said plurality of integrated circuit device designs prior to and after a shrinkage of mask used to form said integrated circuit device designs.

* * * * *